United States Patent [19]

Inagawa et al.

[11] Patent Number: 5,302,798
[45] Date of Patent: Apr. 12, 1994

[54] METHOD OF FORMING A HOLE WITH A LASER AND AN APPARATUS FOR FORMING A HOLE WITH A LASER

[75] Inventors: Hideo Inagawa, Yokohama; Shigenobu Nojo, Kawasaki; Tohru Ohsaka, Yokohama, all of Japan

[73] Assignee: Canon Kabushiki Kaisha, Tokyo, Japan

[21] Appl. No.: 860,687

[22] Filed: Mar. 30, 1992

[30] Foreign Application Priority Data

Apr. 1, 1991 [JP] Japan .................................. 3-68228
Apr. 1, 1991 [JP] Japan .................................. 3-68229
Apr. 1, 1991 [JP] Japan .................................. 3-68230

[51] Int. Cl.$^5$ ............................................. B23K 26/00
[52] U.S. Cl. ............................. 219/121.7; 219/121.77
[58] Field of Search ................ 219/121.71, 121.83, 219/121.7, 121.77

[56] References Cited

U.S. PATENT DOCUMENTS

| | | | |
|---|---|---|---|
| 4,346,284 | 8/1982 | Grollimund et al. | 219/121.7 |
| 4,701,591 | 10/1987 | Masaki et al. | 219/121.77 |
| 4,792,658 | 12/1988 | Langhans et al. | 219/121.63 |
| 4,838,631 | 6/1989 | Chande et al. | 219/121.77 X |
| 5,063,280 | 11/1991 | Inagawa et al. | 219/121.7 |
| 5,073,687 | 12/1991 | Inagawa et al. | 219/121.7 |

FOREIGN PATENT DOCUMENTS 61-95792 5/1986 Japan .
62-216297 9/1987 Japan .

*Primary Examiner*—C. L. Albritton
*Attorney, Agent, or Firm*—Fitzpatrick, Cella, Harper & Scinto

[57] ABSTRACT

A hole forming method with a laser beam and a hole forming laser apparatus improves the efficiency of hole formation without deterioration in the quality of the formed hole. In a hole forming method for forming holes in a plurality of articles by irradiation with a condensed laser beam, the laser beam is switched in succession to plural working optical axes, thereby forming holes in succession in the articles positioned respectively on the working optical axes.

3 Claims, 16 Drawing Sheets

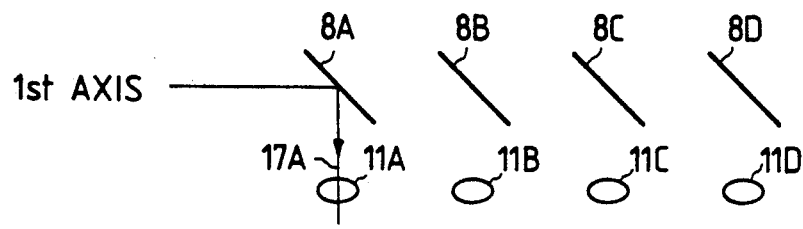
FIG. 2A  1st AXIS
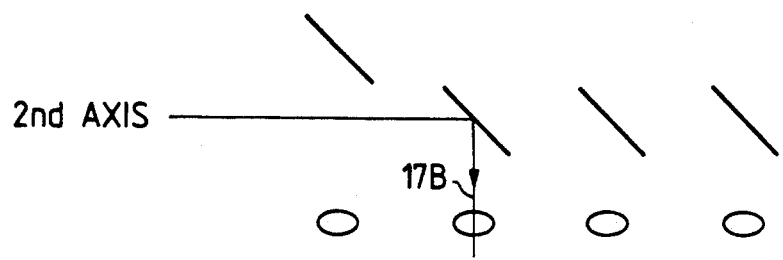
FIG. 2B  2nd AXIS
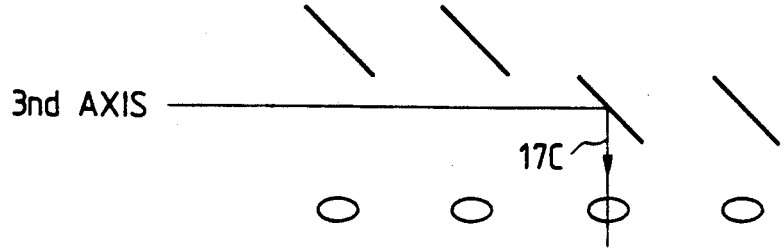
FIG. 2C  3nd AXIS
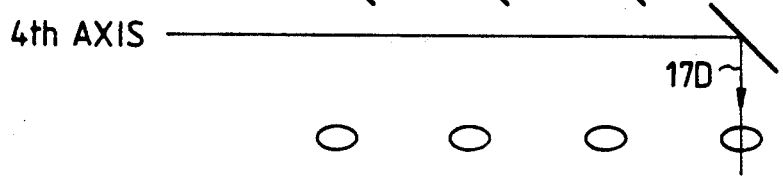
FIG. 2D  4th AXIS

|  | EXAMPLE | 2nd MODIFIED EXAMPLE | CONVENTIONAL METHOD |
|---|---|---|---|
| HOLE SHAPE | △ | ○ | × |
| DAMAGE | ○ | △ | × |
| STABILITY FOR HOLE DIAMETER | ○ | △ | × |

METHOD OF FORMING A HOLE WITH A LASER AND AN APPARATUS FOR FORMING A HOLE WITH A LASER

BACKGROUND OF THE INVENTION

1. Field of the Invention

The present invention relates to a method for forming a hole such as a through hole on a printed circuit board with a laser, and a hole forming laser apparatus.

2. Related Background Art

Formation of holes for mounting electronic parts, such as through holes, on a printed wiring board has generally been conducted with a mechanical method utilizing a drill. In recent years, however, methods for hole formation with a laser beam have been developed in order to respond to the requirements for forming smaller holes resulting from the increasing density of the printed circuit pattern, and non-through holes. Such technology is already known, for example, in the Japanese Patent Laid-Open Applications Nos. 61-95792 and 62-216297. In order to further reduce the working time in such known technology, there is also proposed a method of splitting a laser beam to plural working optical axes with plural partially transmitting mirrors of different reflectances. Improvements in efficiency and cost are necessary to realize commercial application of the hole forming technology with a laser beam also and the above-mentioned method of laser beam splitting to plural optical axes is effective for this purpose.

However, in the latter method mentioned above, the splitting of a laser beam into plural optical axes results in a lowering of the output (intensity) of the laser beam. For example, if a laser beam is split equally into four beams, the intensity of each beam becomes a quarter of the original intensity. Since the working speed is faster and the quality of formed hole becomes higher as the energy per unit time is higher in the laser beam, the above-mentioned conventional method is unable to provide the expected improvement in the working efficiency because of the slower working speed for each hole. Besides, the quality of the formed hole deteriorates due to the lowered beam intensity.

SUMMARY OF THE INVENTION

In consideration of the foregoing, the object of the present invention is to provide a method for forming holes with a laser beam, capable of securely improving the efficiency of hole formation without deteriorating the quality of formed holes, and an apparatus adpated for executing such method.

The above-mentioned object can be attained, according to the present invention, by a method for forming a hole with a laser beam, in which the laser beam is condensed and irradiated onto plural articles to work the hole thereto in one lot comprising the step of switching said laser beam to plural working optical axes in succession, thereby forming a hole in succession on plural articles positioned on said the working optical axes.

The method according to the present invention is characterized in that said laser beam is oscillated in pulse and said switching between the working optical axes is conducted in synchronization with a non-excited interval of said laser beam.

The method according to the present invention is also characterized in that during the non-excited interval within one pulse of the laser beam irradiating an article, the respective irradiations of the laser beam to the other articles are executed so as to be switched in succession.

The method according to the present invention is also characterized in that the switching of said laser beam to said plural working optical axes is conducted by independent movements of a plurality of total reflection mirrors provided with relation to said respective articles, on the irradiating optical axis of said laser beam.

The method according to the present invention is also characterized by further comprising the step of detecting whether the laser beam arrives at said plural working optical axes by photosensors provided with relation to said respective working optical axes.

An apparatus for forming a hole with a laser according to the present invention comprises a laser oscillator for generating a laser beam, plural mirrors positioned on an irradiating optical axis of said laser oscillator in series and each adapted to totally reflect the irradiating laser beam, retraction means for independently retracting said mirrors from said irradiating optical axis, and support means for supporting articles to be worked, respectively, in such a state of positioning on working optical axes of the laser beams totally reflected by said mirrors.

The apparatus of the present invention is also characterized by further comprising a condenser lens positioned on each working optical axis and for condensing the corresponding laser beam.

The hole forming method with laser beam and the hole forming laser apparatus according to the present invention, being constructed as explained above allow the hole forming operation by switching a laser beam in succession to plural working optical axes. The working efficiency can be improved since the article needs not be moved at each hole forming operation, and plural articles can be worked with a single positioning operation.

Also, since the single laser beam is not split, the intensity of the laser beam employed in hole formation is not lowered, so that it is rendered possible to reduce the working time and to ensure quality hole formation.

Also, the total reflection mirrors are moved during the non-excited period within a pulse of the laser beam. This fact allows effective use of the non-excited period which is required for satisfactory hole formation, and it is not necessary to provide the separate period for mirror movement, so that the working efficiency is further improved.

BRIEF DESCRIPTION OF THE DRAWINGS

FIGS. 2A to 2D are views showing the states of mirrors when the laser beam is shifted to different optical axes;

DETAILED DESCRIPTION OF THE PREFERRED EMBODIMENTS

Now the present invention will be described in detail by embodiments thereof shown in the attached drawings.

Figure 1:
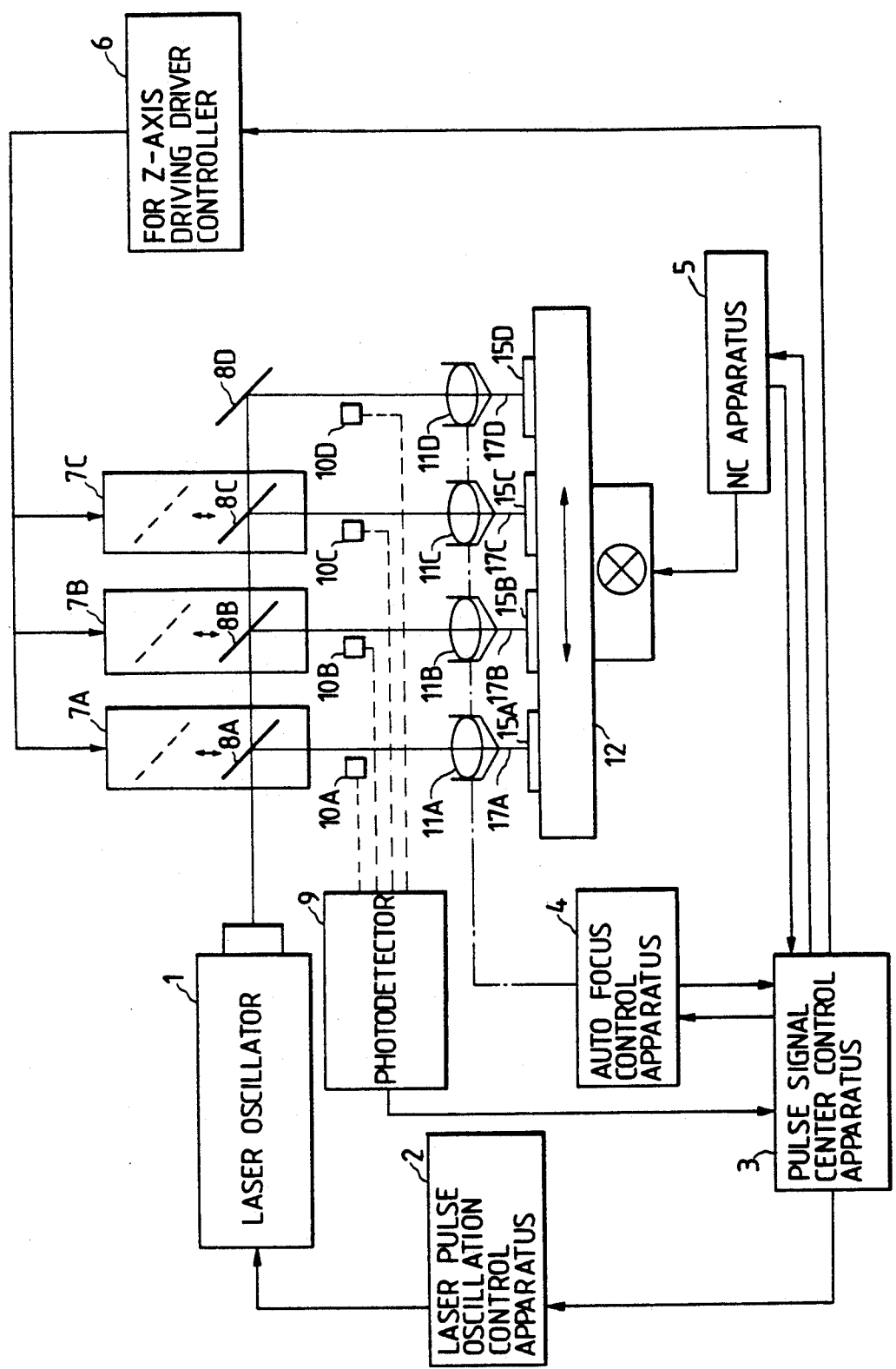
FIG. 1 is a schematic view of a hole forming laser apparatus constituting an embodiment of the present invention.

FIG. 1 is a schematic view of a hole forming laser apparatus according to an embodiment of the present invention, wherein a laser oscillator 1 for generating a laser beam, is connected to a laser pulse oscillation control apparatus 2 for controlling the oscillation state of laser beam. On the irradiation optical axis of the laser oscillator 1, there are provided four total reflection mirrors 8A-8D in series, each allowing the irradiation laser beam to reflect in a perpendicular direction to said optical axis. Among said four total reflection mirrors 8A-8D, the mirror 8D is fixed, but three mirrors 8A-8C positioned closer to the laser oscillator 1 are provided with mirror driving mechanisms 7A-7C for independently retracting said totally reflecting mirrors 8A-8C from the irradiation optical axis. Said mirror driving mechanisms 7A-7C are connected to a Z-axis driver controller 6 which switches the laser beam from the oscillator 1 in succession to the working optical axes 17A-17D by selectively retracting the mirrors 8A-8C.

Also, at the positions corresponding to the working optical axes 17A-17D of the laser beam reflected totally by the mirrors 8A-8D, respectively, there are located photosensors 10A-10D connected to a photodetector 9 for judging whether the laser beam arrives at the optical axes 17A-17D, on the basis of detection signals from said photosensors.

Also, on the working optical axes 17A-17D, there are respectively located working heads 11A-11D each of which is provided therein with a condenser lens for focusing the parallel laser beam to a point. Said working heads 11A-11D are respectively supported by head drivers (not shown) which independently move the working heads 11A-11D in the axial direction,, thereby axially moving the condensing point of the laser beam (focal point of the condenser lens in each of the working heads 11A-11D) and focusing it onto printed circuit boards 15A-15D constituting the articles to be worked. This focusing operation is controlled by an auto focusing controller connected to the lens drivers.

In forward positions on the optical axes of the condenser lenses 11A-11D and respectively corresponding to the working optical axes 17A-17D, there are located printed circuit boards 15A-15D, which are the articles to be worked and detachably supported by an X-Y table 12 movable in the lateral (X) direction and perpendicular (Y) direction with respect to the plane of the drawing. Said X-Y table 12 is connected to a numerical control (NC) apparatus 5 and is driven by the commands of said apparatus 5. Thus, after forming a hole in each board, the boards 15A-15D are moved in the X-and Y-directions with respect to the working optical axes 17A-17D, whereby plural holes can be formed in each of said boards 15A-15D.

The laser pulse oscillation control apparatus 2, auto focusing control apparatus 4, NC apparatus 5, Z-axis driving controller 6 and photodetector 9 are connected to a pulse signal center control apparatus 3 which controls the entire hole forming laser apparatus.

In the following there will be explained the function of the above-explained hole forming laser apparatus, taking a case of switching the laser beam to four optical axes in succession.

The pinted circuit boards 15A-15D to be worked are fixed on the X-Y table 12, which suitably positions said boards 15A-15D for first hole formation, under the control of the NC apparatus 5. Upon completion of said positioning, a positioning end signal is sent to the pulse signal center control apparatus 3, which in response sends a start signal to the auto focusing control apparatus 4.

The auto focusing controller 4 controls the head drivers (not shown) to axially move the working heads 11A-11D having condenser lenses therein, thereby regulating the positions of said condenser lenses so that the laser beams are focused onto the boards 15A-15D. Upon completion of said focusing operation, the auto focusing control apparatus 4 sends a focusing end signal to the pulse signal center control apparatus 3.

Then, the working points on the boards 15A-15D are irradiated by the laser beam. In this operation, the laser beam emitted from the laser oscillator 1 is selectively reflected by the total reflection mirrors 8A-8C coupled with the mirror driving mechanisms 7A-7C and the fixed mirror 8D, thereby irradiating the boards 15A-15D in succession. More specifically, one of four boards 15A-15D can be irradiated with the laser beam, by selectively retracting the mirrors 8A-8C from the optical axis of the laser oscillator 1 by means of the driving mechanisms 7A-7C, as indicated by broken lines.

As a characteristic of laser hole forming, it is already known that an intermittent beam irradiation is superior to a continuous beam irradiation, in the quality of the formed hole, in order to effect heat dissipation of the hole forming part and discharging of reaction gas during the intervals in such intermittent beam irradiation.

For this reason, in order to selectively irradiate the boards 15A-15D with the laser beam, it is necessary to exactly synchronize the oscillation pulses of the laser with the drive timing of the total reflecting mirrors 8A-8D. For this purpose, the pulse signal center control apparatus 3 sends precisely timed pulses to the laser pulse oscillation control apparatus 2 and the Z-axis driving controller 6 for controlling the mirror driving mechanisms 7A-7D. The laser oscillator 1 and the mirror driving mechanisms 7A-7D are controlled according to said pulse signals, whereby the laser beam pulses are synchronized with the timing of movement of the total reflection mirrors 8A-8D, and the laser beam can be switched to the working optical axes 17A-17D in succession.

The movement of the total reflection mirrors 8A-8D is conducted during the interval between the successive irradiations of the laser beam, whereby said interval required for achieving satisfactory hole formation can be effectively utilized, and there is not required a separate time for mirror movement.

The photodetector 9 receives the signals from the photosensors 10A-10D to detect the light arriving at the respective optical axes, and the detection light signals are fed back to the pulse signal center control apparatus 3. Based on said detection signals, said control apparatus 3 judges whether the timing of laser oscillation is satisfactorily synchronized with the drive timing of the mirrors 8A-8D. The control apparatus 3 sends necessary commands to the various apparatus such as a command for stopping the functions thereof if the synchronization between them is not satisfactory, or an abnormal situation such as the light not arriving at the required position is detected.

When the laser beam is irradiated to the respective boards 15A-15D and the irradiation of sufficient laser pulses for the first hole formation is completed, the pulse signal center control apparatus 3 sends a hole formation end signal to the NC apparatus 5 which, in response, drives the X-Y table 12, thereby positioning the boards 15A-15D for the second hole formation. Subsequently the boards 15A-15D are in succession irradiated with the laser beam, as in the first hole formation, whereby the second hole formation is completed. Thereafter, all the required holes are formed on the boards 15A-15D, by repeating the movement and positioning of the X-Y table 12 and the hole formation by laser beam irradiation.

Figure 3:
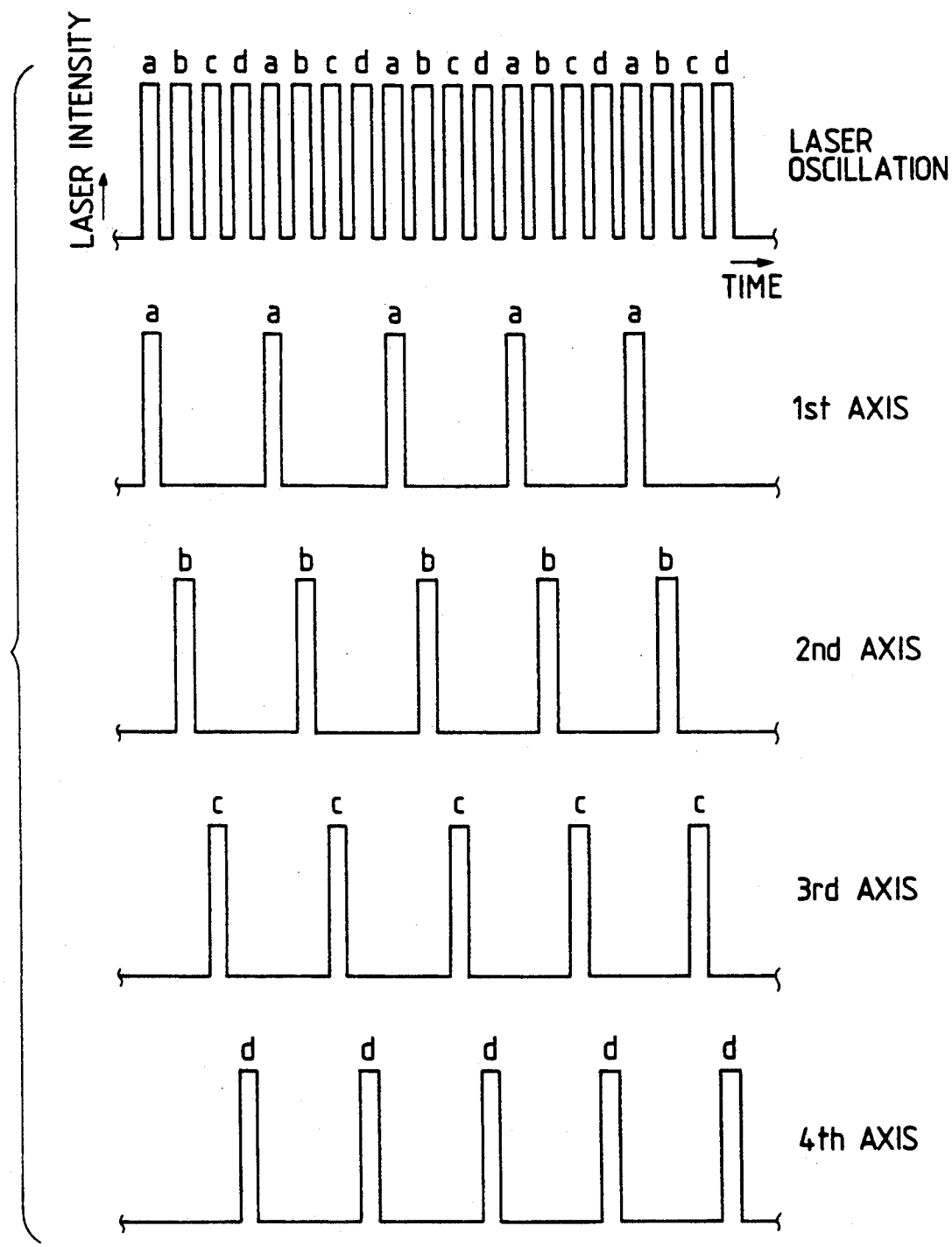
FIG. 3 is a view showing output states of laser pulses respectively corresponding to the states of mirrors shown in FIGS. 2A to 2D.

FIGS. 2 and 3 more specifically illustrate the mode of laser beam switching to the working optical axes 17A-17D. FIGS. 2A to 2D illustrate that the laser beam is directed to the first axis 17A when all the total reflection mirrors 8A-8D are positioned on the optical axis with respect to the emerging optical axis of the laser oscillator 1, then to the second axis 17B when the mirror 8A is retracted from said optical axis, then to the third axis 17C when the mirrors 8A, 8B are retracted, and to the fourth axis 17D when the mirrors 8A-8C are retracted. FIG. 3 shows the laser oscillation in each state, namely the laser beam pulses given to each working point.

Figure 4:
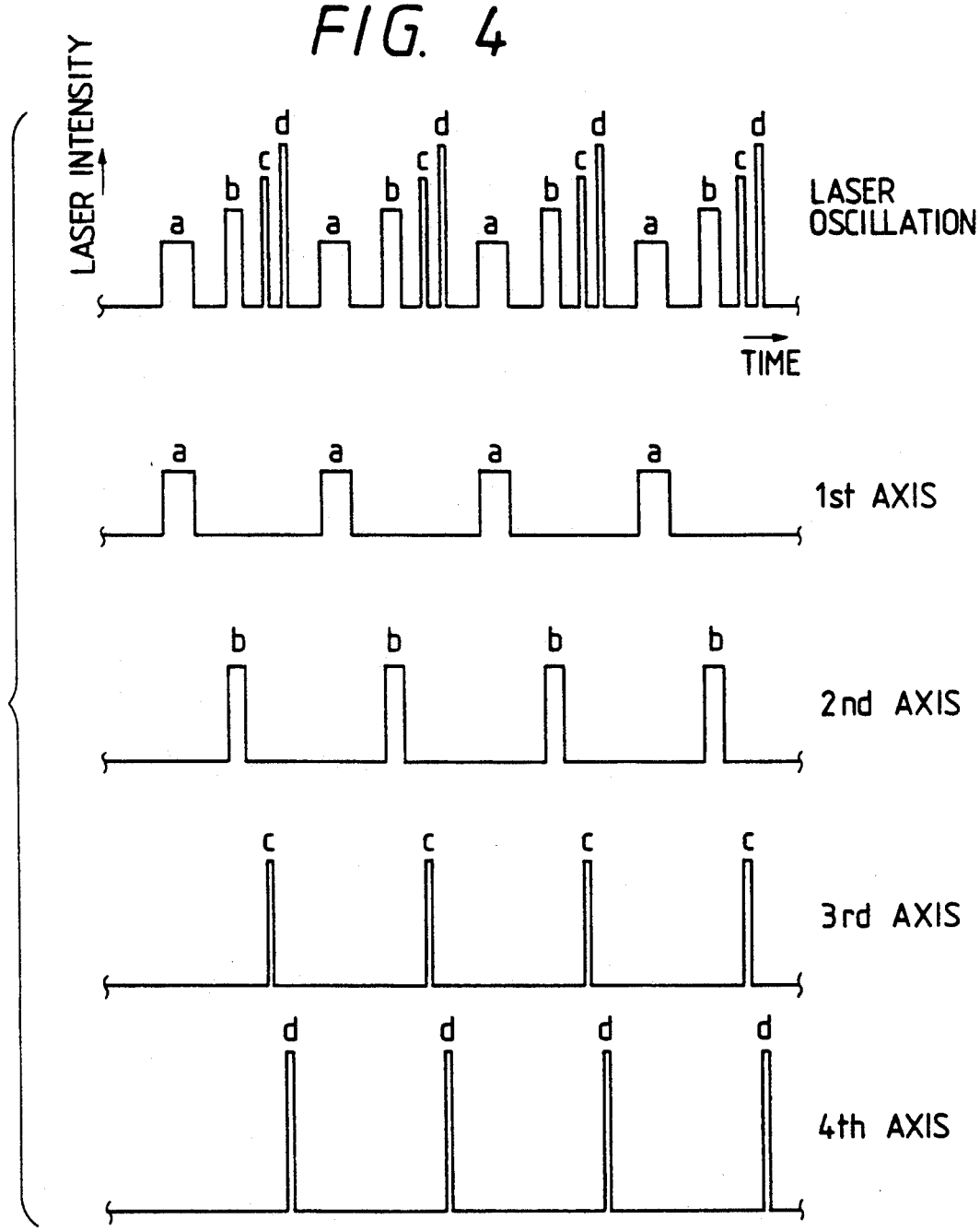
FIGS. 4 and 5 are views showing variations in the output states of laser pulses.
Figure 5:
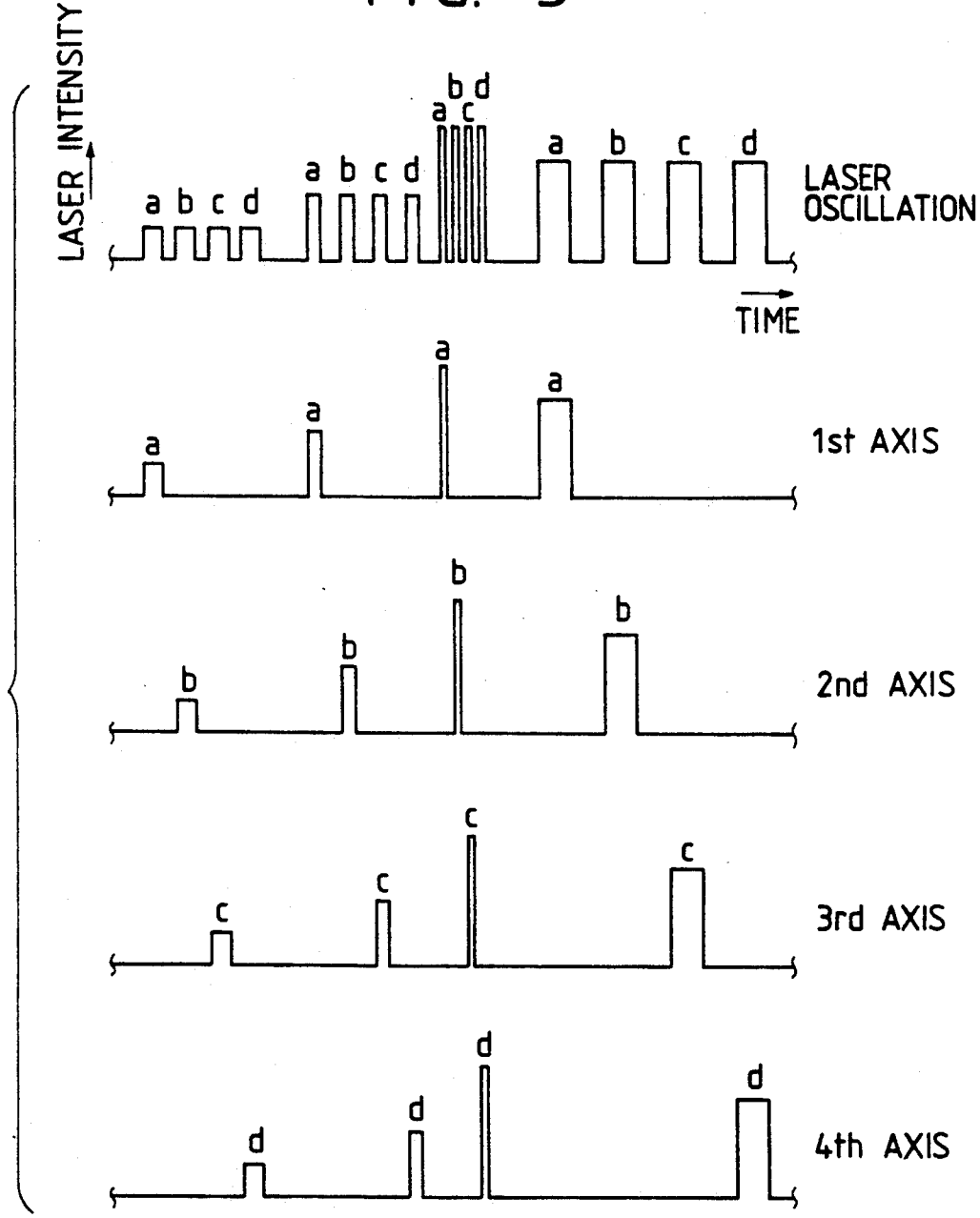

The output pulses of the laser oscillator 1 shown in FIG. 3 are constant in repeating period and height (intensity). It is also possible that the output pulses are varied in height, duration and repeating period as shown in FIGS. 4 and 5 to cope with the difference in shape of the article to be worked or to form holes of different shapes. The heat conductivity and the diffusivity of heat becomes variable, depending on the differences of the material and shape of the article to be worked and the shape of the hole. In this case, it is possible, for example, to extend each irradiation time for the article to be worked with low heat conductivity, and to extend the interval between the irradiation and the next irradiation to extend the time for heat dissipation for the article to be worked with low diffusivity of heat.

The above-explained embodiment enables hole formations by switching the laser beam in succession to plural optical axes, mirror movements synchronized with the laser oscillation. Consequently, the printed circuit boards need not be moved after each hole formation, and plural boards can be subjected to hole formation by one positioning, whereby the efficiency of working can be improved.

Also, since the laser beam is not split the beam intensity employed in hole formation is not reduced. It is, therefore, rendered possible to shorten the working time and to ensure satisfactory quality in the formed hole.

The present invention is subject to modification or variations within its scope.

For example, the foregoing embodiment has been described with four axes, but the number of axes may naturally be increased or decreased.

Figure 6:
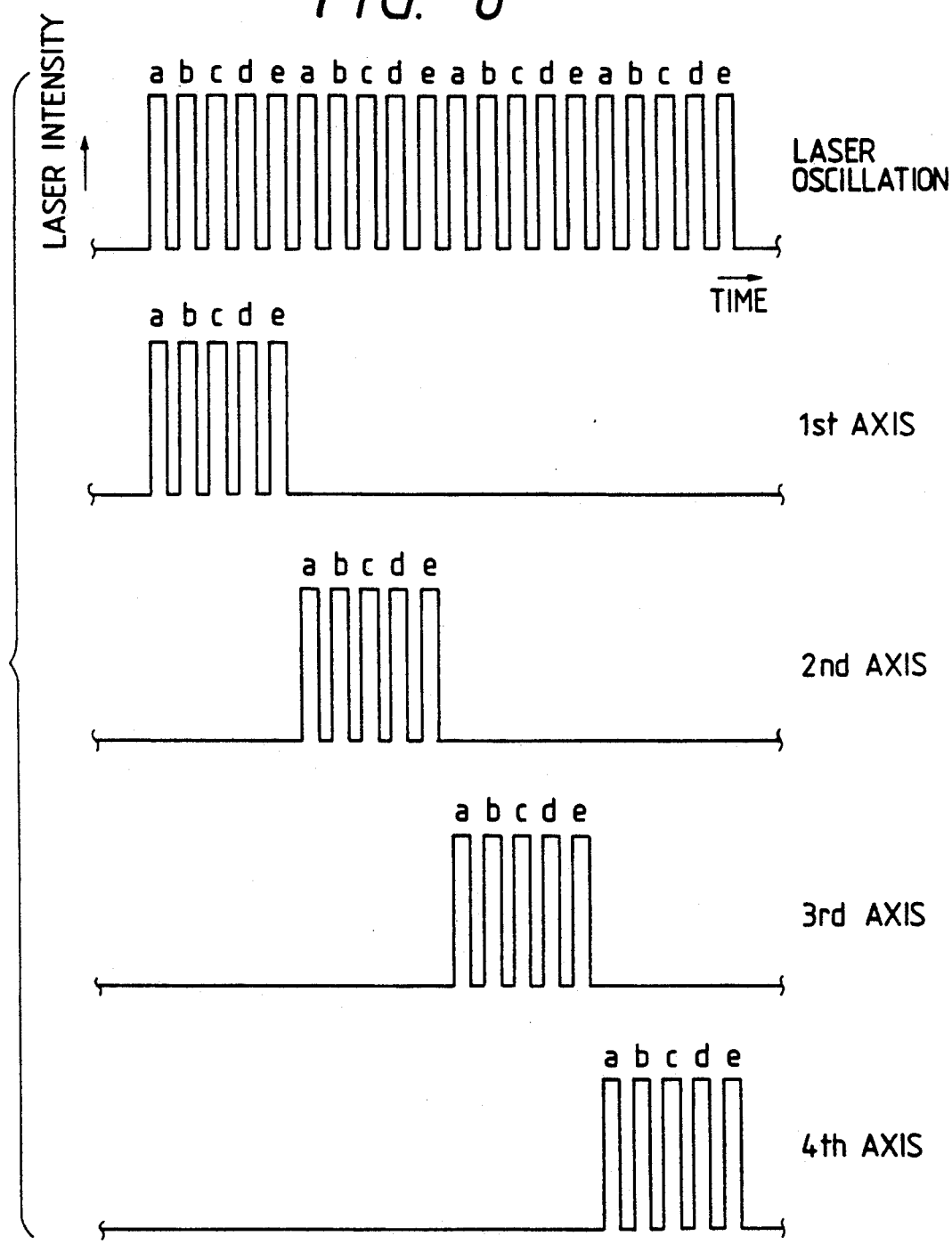
FIGS. 6 to 8 are views showing other examples of the output states of laser pulses.
Figure 7:
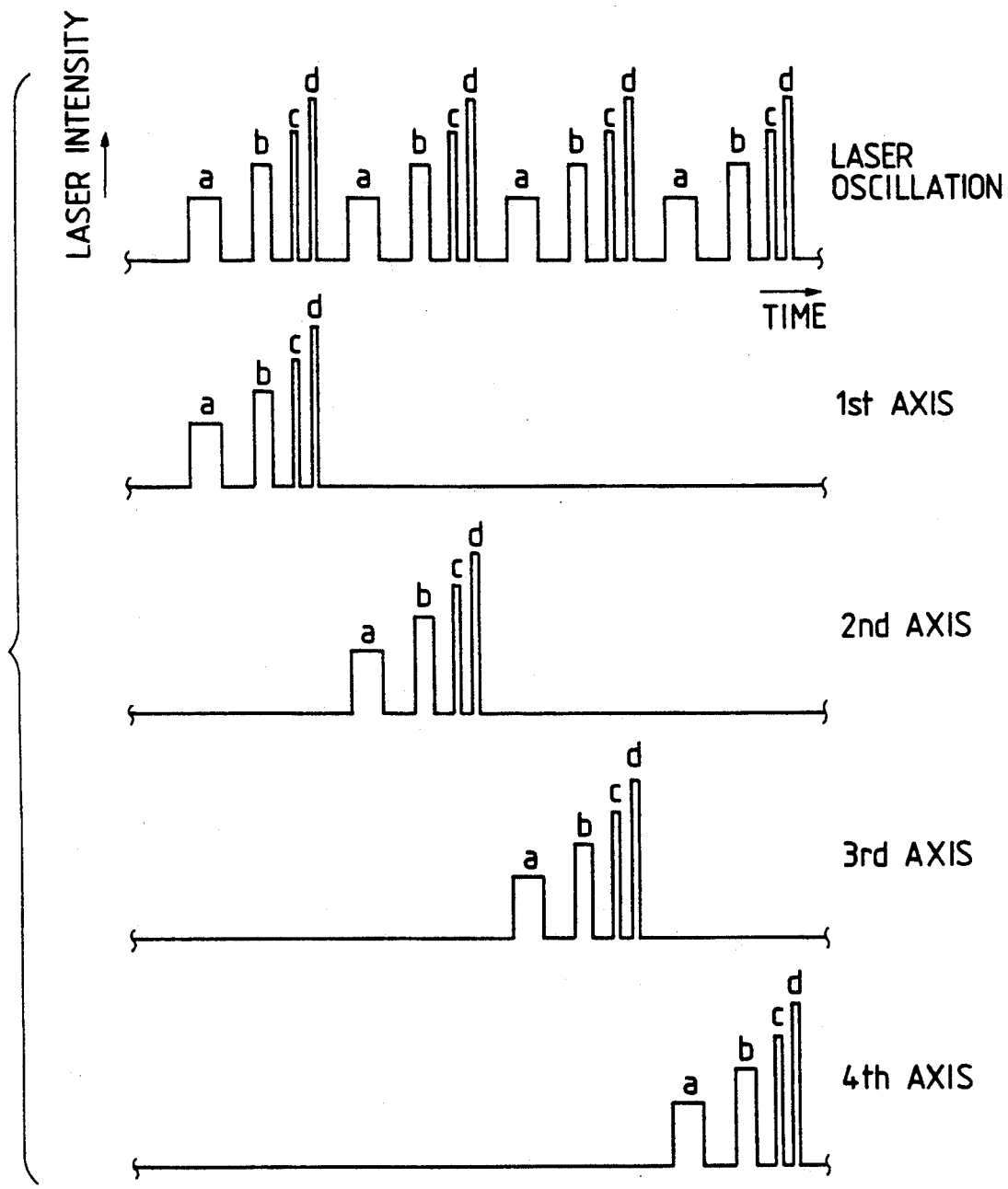
Figure 8:
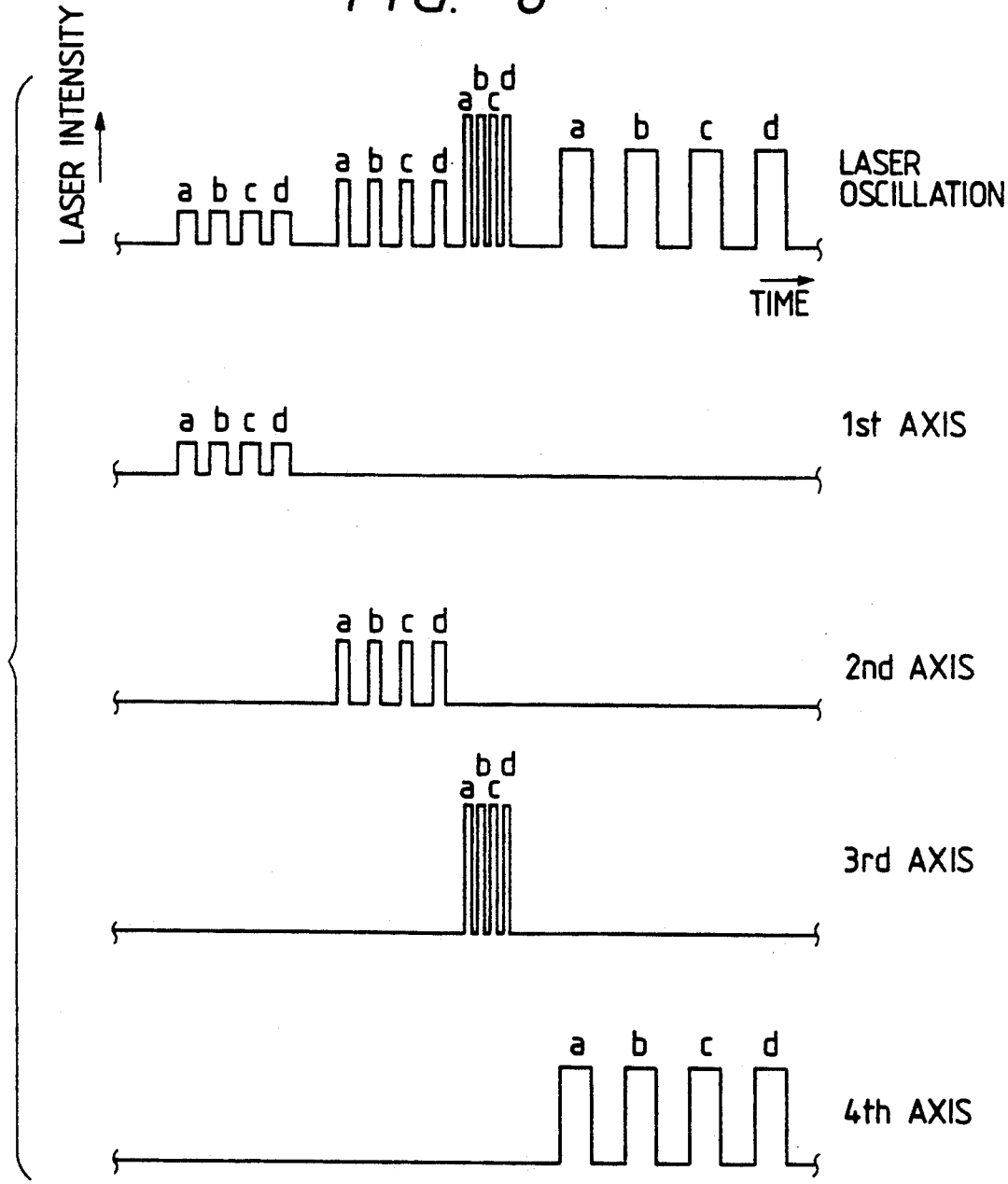

FIG. 6 shows the output pulses of the laser oscillator 1, constant in repeating period and height (intensity). It is also possible that the output pulses are varied in height, duration and repeating period as shown in FIGS. 7 and 8 to cope with the difference in the shape of the article to be worked or to form holes of different shapes. The heat conductivity and the diffusivity of heat become variable, depending on the differences of the material and shape of the article and the shape of the hole. In this case, it is possible, for example, to extend each irradiating time for the article to be worked with low heat conductivity, and to extend the interval between irradiation and the next irradiation to prolongate the heat dissipating time for the article to be worked with low diffusivity of heat. It is furthermore possible, as shown in FIG. 7, to vary the height, duration and interval of the pulses in the course of a hole formation, and optimum hole forming conditions can be realized by such pulse variation.

In the following there will be explained a second preferred embodiment of the present invention with reference to the attached drawings.

Figure 9:
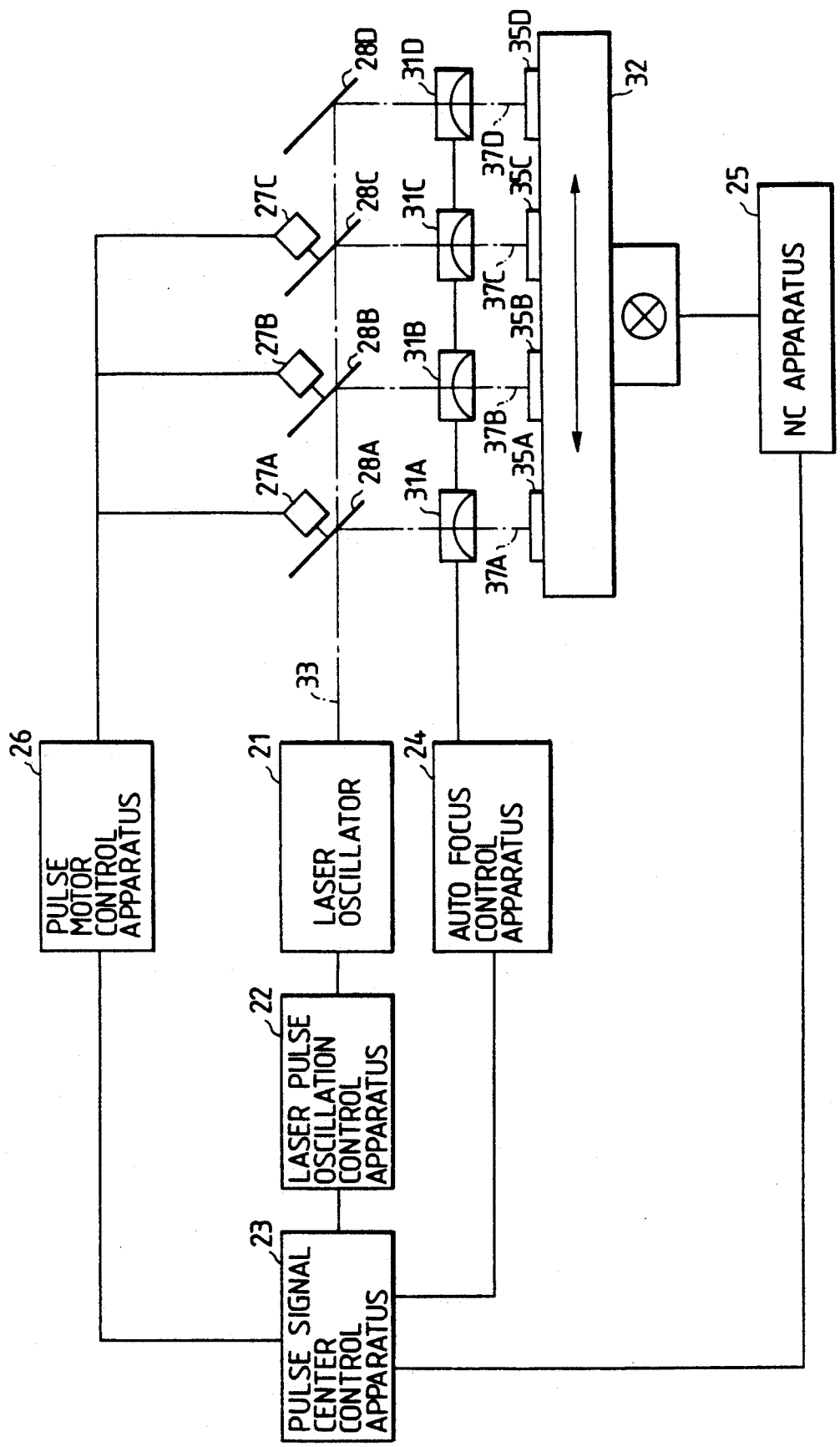
FIG. 9 is a schematic view of a hole forming laser apparatus constituting a second embodiment of the present invention.
Figure 10A:
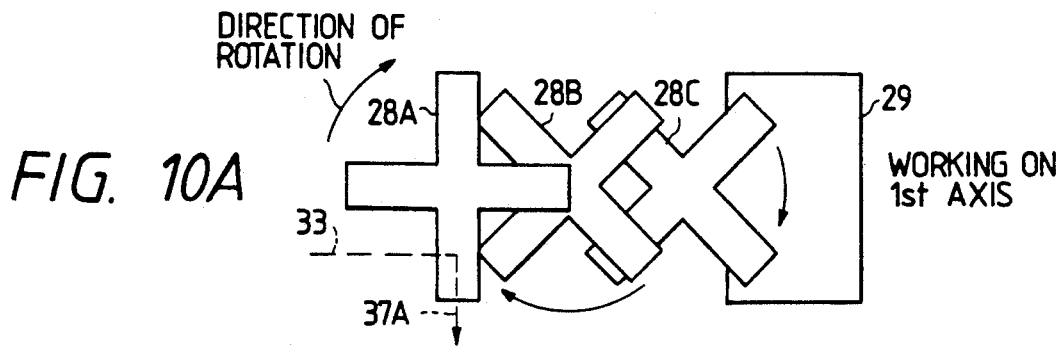
FIGS. 10A to 10D are views showing specific ways of laser beam shifting to different axes.
Figure 10B:
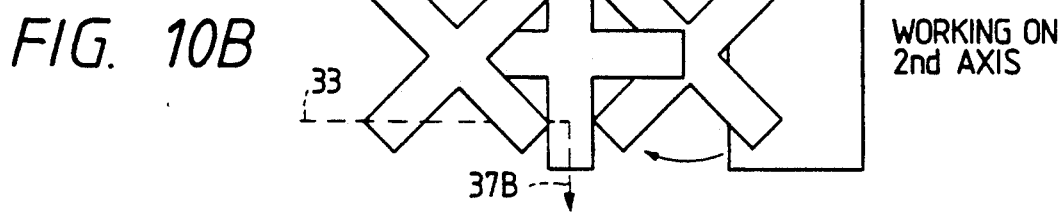
Figure 10C:
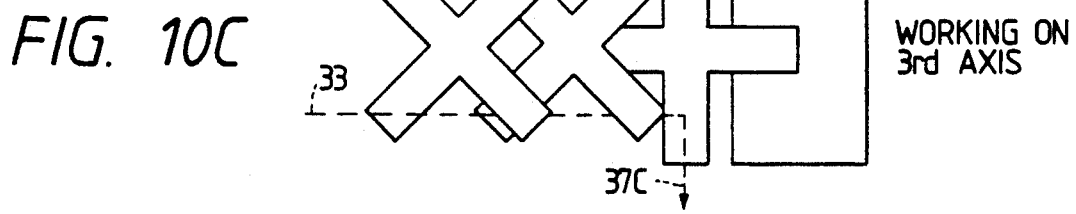
Figure 10D:
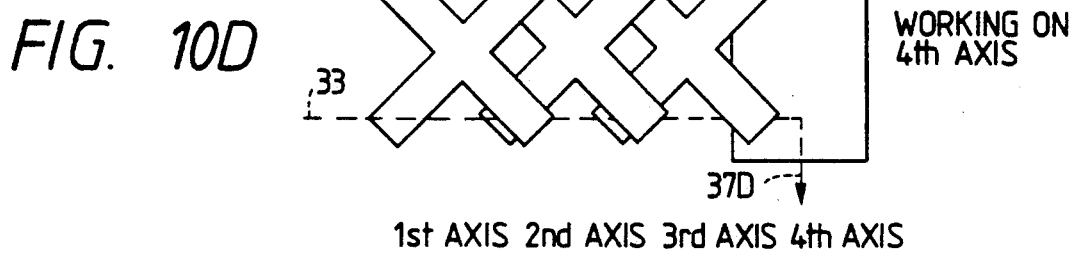

FIG. 9 is a schematic view of a second embodiment of the hole forming laser apparatus, in which a laser oscillator 21 for generating a laser beam is connected to a laser pulse oscillation control apparatus 22 for controlling the oscillation state of the laser beam. On the irradiating optical axis of the laser oscillator 21, there are arranged four reflecting members 28A-28D in series, each having a reflecting face capable of totally reflecting the irradiating laser beam to the perpendicular direction to said optical axis. Among said four reflecting members 28A-28D, the last one 28D is fixed, while three members 28A-28C positioned closer to the laser oscillator 21 are equipped with pulse motors 27A-27C for rotating said members 28A-28C. Said reflecting members 28A-28C are rotated by a predetermined angle by the pulse motors 27A-27C, whereby the reflecting faces of said members is shifted between a position intercepting the irradiating optical axis and a non-intercepting position, and a state reflecting the laser beam or a non-reflecting state is switched. Said pulse motors 27A-27C are connected to a pulse motor control apparatus 26 which selectively rotates said reflecting members 28A-28C, thereby switching the laser beam from the laser oscillator 21 in succession to working optical axes 37A-37D.

On the working optical axes 37A-37D, there are respectively located working heads 31A-31D each of which is provided therein with a condenser lens for focusing the parallel laser beam to a point. Said working heads 31A-31D are respectively supported by head drivers (not shown) which independently move the working heads 11A-11D in the axial direction thereby axially moving the condensing point of the laser beam (focal point of the condenser lens in each of the working heads 31A-31D) and focusing onto printed circuit board 35A-35D constituting the articles to be worked. This focusing operation is controlled by an auto focus control apparatus 24 connected to the lens drivers.

In forward positions on the optical axes of the condenser lenses 31A–31D and respectively corresponding to the working optical axes 37A–37D, there are located printed circuit boards 35A–35D, which are the articles to be worked and detachably supported by an X-Y table 32 which is rendered movable in the lateral (X) direction and perpendicular (Y) direction with respect to the plane of the drawing. Said X-Y table 32 is connected to a numerical control (NC) apparatus 25 and is driven by the commands of said apparatus 25. Thus, after hole formation in each board, the boards 35A–35D are moved in the X- and Y-directions with respect to the working optical axes 37A–37D, whereby plural holes can be formed in each of said boards 35A–35D.

The laser pulse oscillation control apparatus 22, auto focus control apparatus 24, NC apparatus 25, and pulse motor control apparatus 26 are connected to a pulse signal center control apparatus 23 which controls the entire hole forming laser apparatus.

In the following there will be explained the function of the above-explained hole forming laser apparatus, taking a case of switching the laser beam to four optical axes in succession.

The printed circuit boards 35A–35D to be worked are fixed on the X-Y table 32, which suitably positions said boards 35A–35D for first hole formation, under the control of the NC apparatus 25. Upon completion of said positioning, a positioning end signal is sent to the pulse signal center control apparatus 23, which in response sends a start signal to the auto focus control apparatus 24.

The auto focus control apparatus 24 controls the head drivers (not shown) to axially move the working heads 31A–31D having condenser lenses therein, thereby regulating the positions of said condenser lenses so that the laser beams are focused onto the boards 35A–35D. Upon completion of said focusing operation, the auto focus control apparatus 24 sends a focusing end signal to the pulse signal center control apparatus 23.

Then, the working points on the boards 35A–35D are irradiated by the laser beam. In this operation, the laser beam emitted from the laser oscillator 21 is reflected by the reflecting members 28A–28C rotated by the pulse motors 27A–27C and the fixed totally reflecting mirror 28D, thereby irradiating the boards 35A–35D. Each of the reflecting members 28A–28C is a cross-shaped member composed of a total reflection mirror, as shown in FIG. 10. More specifically, one of four boards 35A–35D can be irradiated with the laser beam, by selectively rotating the reflecting members 28A–28C by the pulse motors 27A–27C, thereby shifting said members between a state reflecting the laser beam and a state transmitting said laser beam.

As a characteristic of laser hole forming, it is already known that an intermittent beam irradiation is superior to a continuous beam irradiation, in the quality of the formed hole, in order to effect heat dissipation of the hole forming part and discharging of reaction gas during the intervals in such intermittent beam irradiation.

For this reason, in order to selectively irradiate the boards 35A–35D with the laser beam, it is necessary to exactly synchronize the oscillation pulses of the laser with the timing of rotation of the reflecting members 28A–28C. For this purpose, the pulse signal center control apparatus 23 sends precisely timed pulses to the laser pulse oscillation control apparatus 22 and the pulse motor control apparatus 26 for controlling the rotation of the pulse motors 27A–27C. The laser oscillator 21 and the pulse motors 27A–27C are controlled according to said pulse signals, whereby the laser beam pulses are synchronized with the timing of rotation of the reflecting members 28A–28C, and the laser beam can be switched to the working optical axes 37A–37D.

The rotation of the reflecting members 28A–28C is conducted during the interval between the successive irradiations of the laser beam, whereby said interval required for achieving satisfactory hole formation can be effectively utilized, and there is not required a separate time for the rotation of the reflecting members 28A–28C.

When the laser beam is irradiated to the respective boards 35A–35D and irradiation of sufficient laser pulses for the first hole formation is completed, the pulse signal center control apparatus 23 sends a hole formation end signal to the NC apparatus 25 which, in response, drives the X-Y table 32, thereby positioning the boards 35A–35D for the second hole formation. Subsequently, the boards 35A–35D are in succession irradiated with the laser beam, as in the first hole formation, whereby second hole formation is completed. Thereafter, all the required holes are formed on the boards 35A–35D, by repeating the movement and positioning of the X-Y table 32 and the hole formation by laser beam irradiation.

Figure 11:
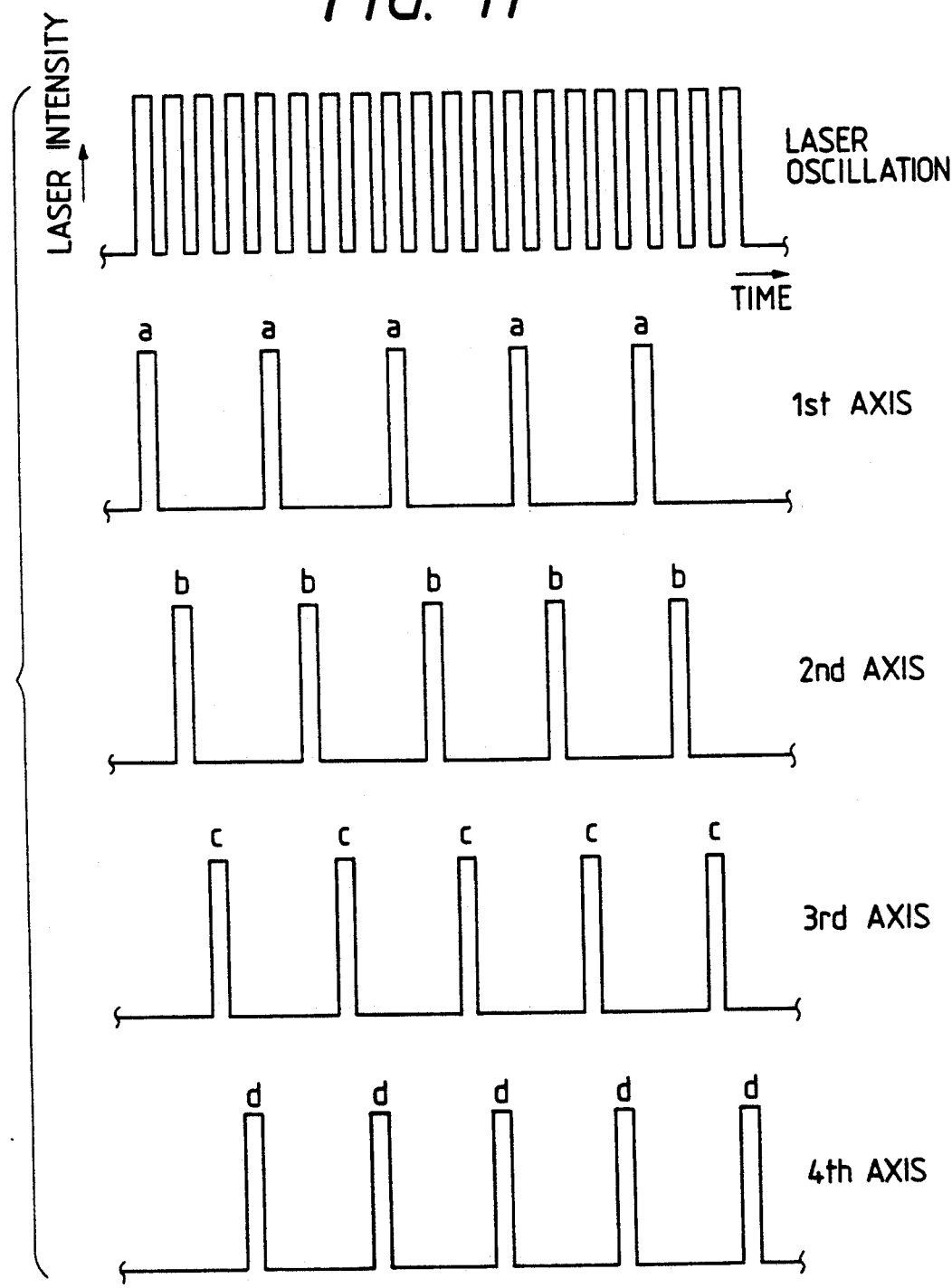
FIG. 11 is a view showing the output states of laser pulses corresponding to the states of mirrors shown in FIG. 10.

FIGS. 10 and 11 more specifically illustrate the mode of laser beam switching to the working optical axes 37A–37D. The laser beam is directed to the first axis 37A when the reflecting member 28A intercepts the optical axis 33 as shown in FIG. 10A, to the second axis 37B when the optical axis 33 is not intercepted by the reflecting member 28A but by 28B as shown in FIG. 10B, to the third axis 37C when the optical axis 33 is not intercepted by the reflecting members 28A, 28B but by 28C as shown in FIG. 10C, and to the fourth optical axis 37D when the optical axis 33 is not intercepted by the reflecting members 28A–28C as shown in FIG. 10D. FIG. 11 shows the laser oscillation in each state, namely the laser beam pulses given to each working point.

The above-explained embodiment enables hole formations by switching the laser beam in succession to plural optical axes, by rotations of the reflecting members 28A–28C in synchronization with the laser oscillation. Consequently, the printed circuit boards need not be moved after each hole formation, and plural boards can be subjected to hole formation by one positioning, whereby the efficiency of working can be improved.

Also, since the laser beam is not split, the beam intensity employed in hole formation is not reduced. It is, therefore, rendered possible to shorten the working time and to ensure satisfactory quality in the formed hole.

Also, the movements of mirrors can be conducted during the interval between the irradiations, so that said interval, which is required for achieving satisfactory hole formation, can be effectively utilized.

The present invention is not limited by the foregoing embodiment but is subject to various modifications within the scope of the present invention.

In the following there will be explained variations of the foregoing embodiments. In the following description, the same components as those in the foregoing embodiments are represented by the same number, and will not be explained further.

Figure 12:
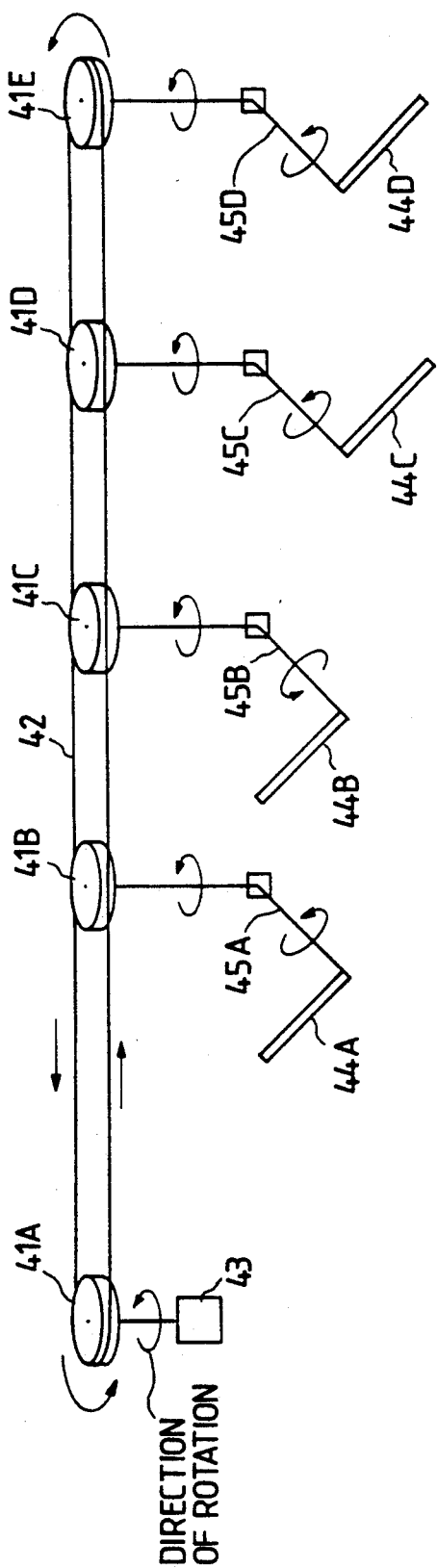
FIG. 12 is a view showing a first variation.

FIG. 12 illustrates a first variation, which is different from the foregoing embodiment in the rotatable reflecting members and in the driving method therefor.

A pulse motor 43 is equipped with a pulley 41A, of which rotation is transmitted through a belt to pulleys 41B-41E, whereby reflecting members 44A-44D are rotated with the same speed as that of the pulse motor 43. In this manner the laser beam is switched to the 4 working optical axes.

Figure 13:
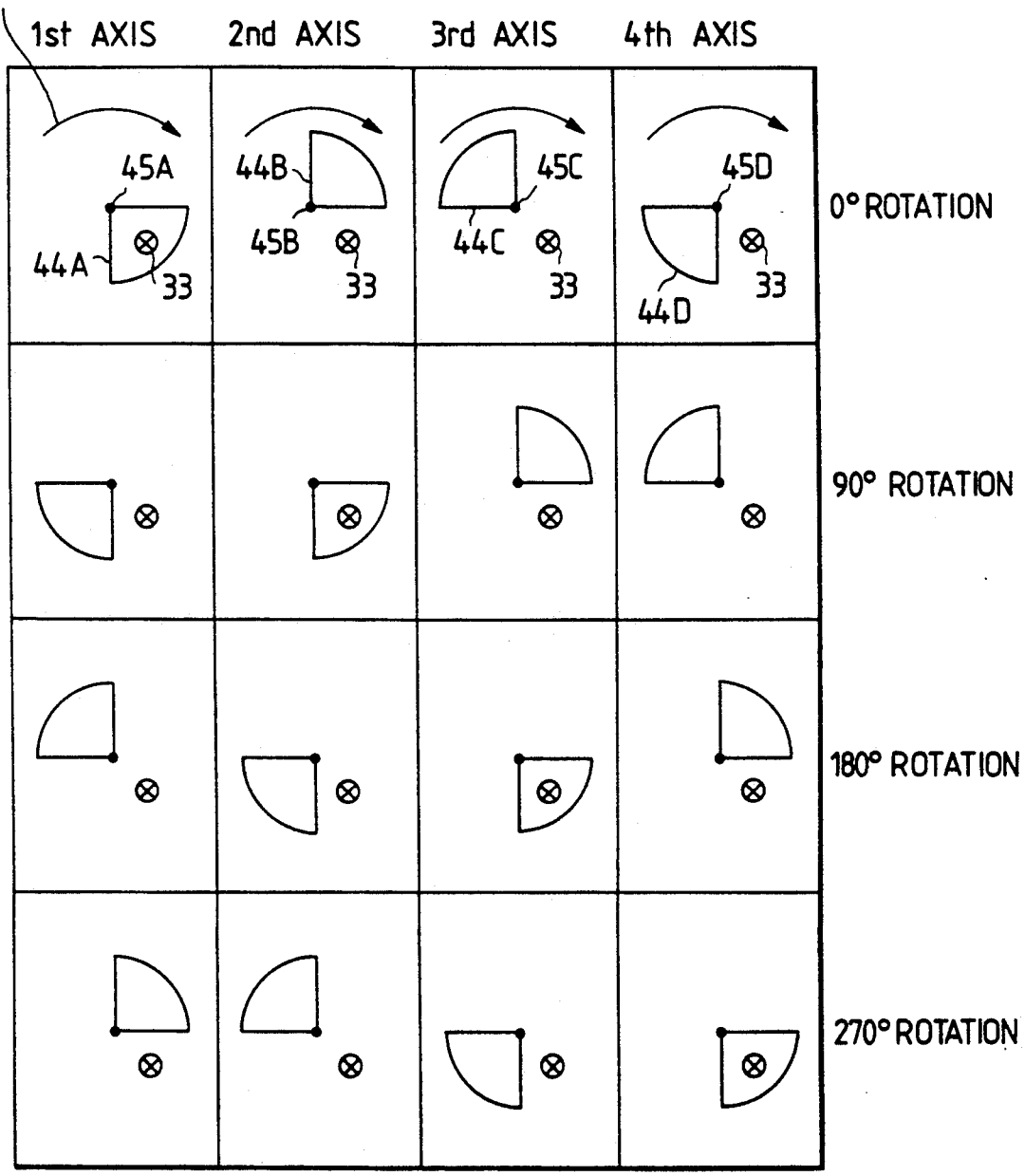
FIG. 13 is a schematic view showing the laser beam shifting in said first variation.

FIG. 13 schematically illustrates the switching of the laser beam in this first variation, in which shown are rotary shafts 45A-45D and a laser optical axis 33 seen from the laser oscillator 21. At each simultaneous rotation of the reflecting members 44A-44D by 90°, one of said reflecting members 44A-44D appears on the laser optical path in succession, whereby the laser beam is switched from the 1st axis to the 4th axis.

Figure 14:
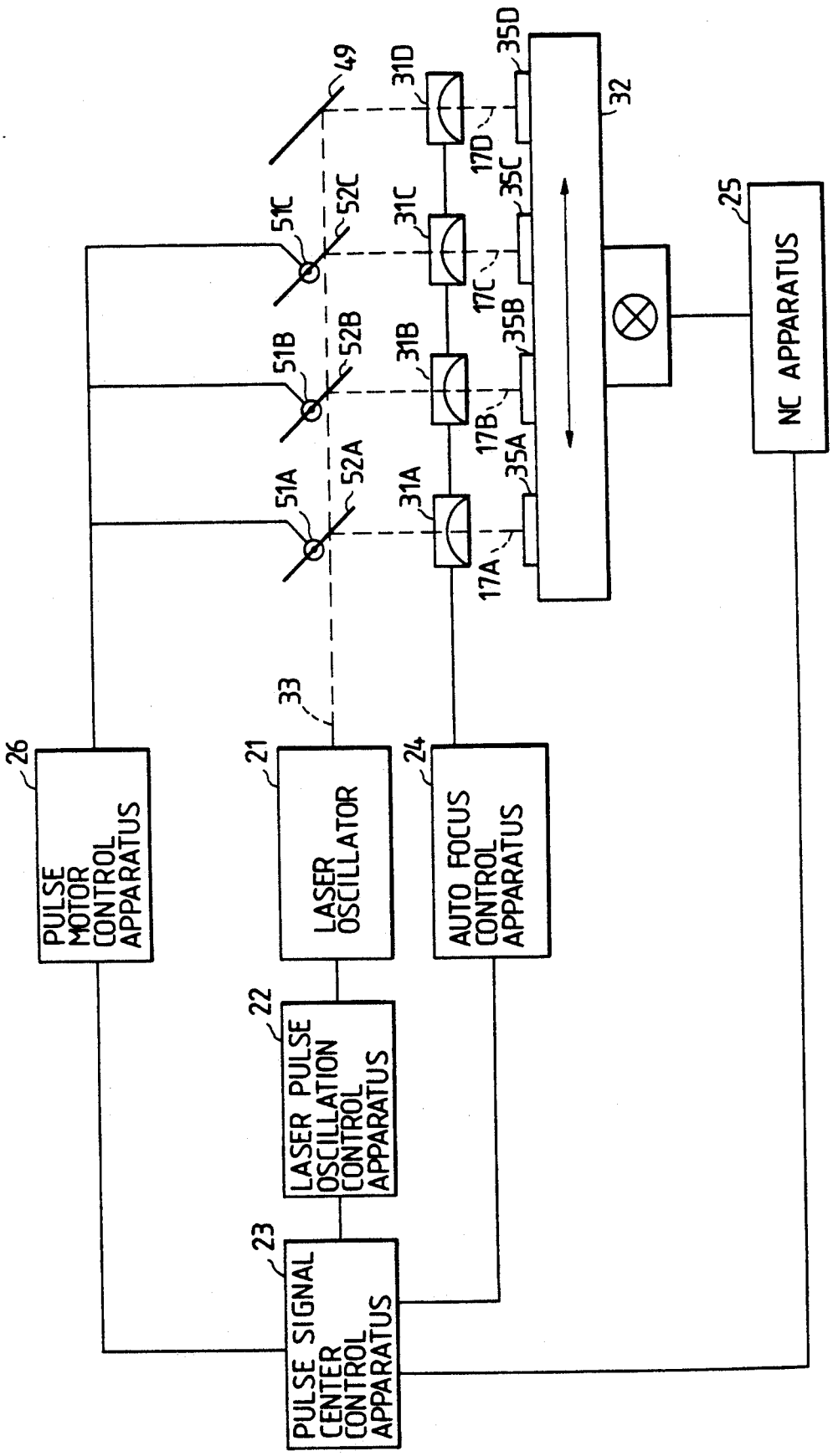
FIG. 14 is a view showing a second variation.

FIG. 14 illustrates a second variation, provided with pulse motors 51A-51C and reflecting members 52A-52C. Other structures are the same as those in FIG. 9.

Figure 15:
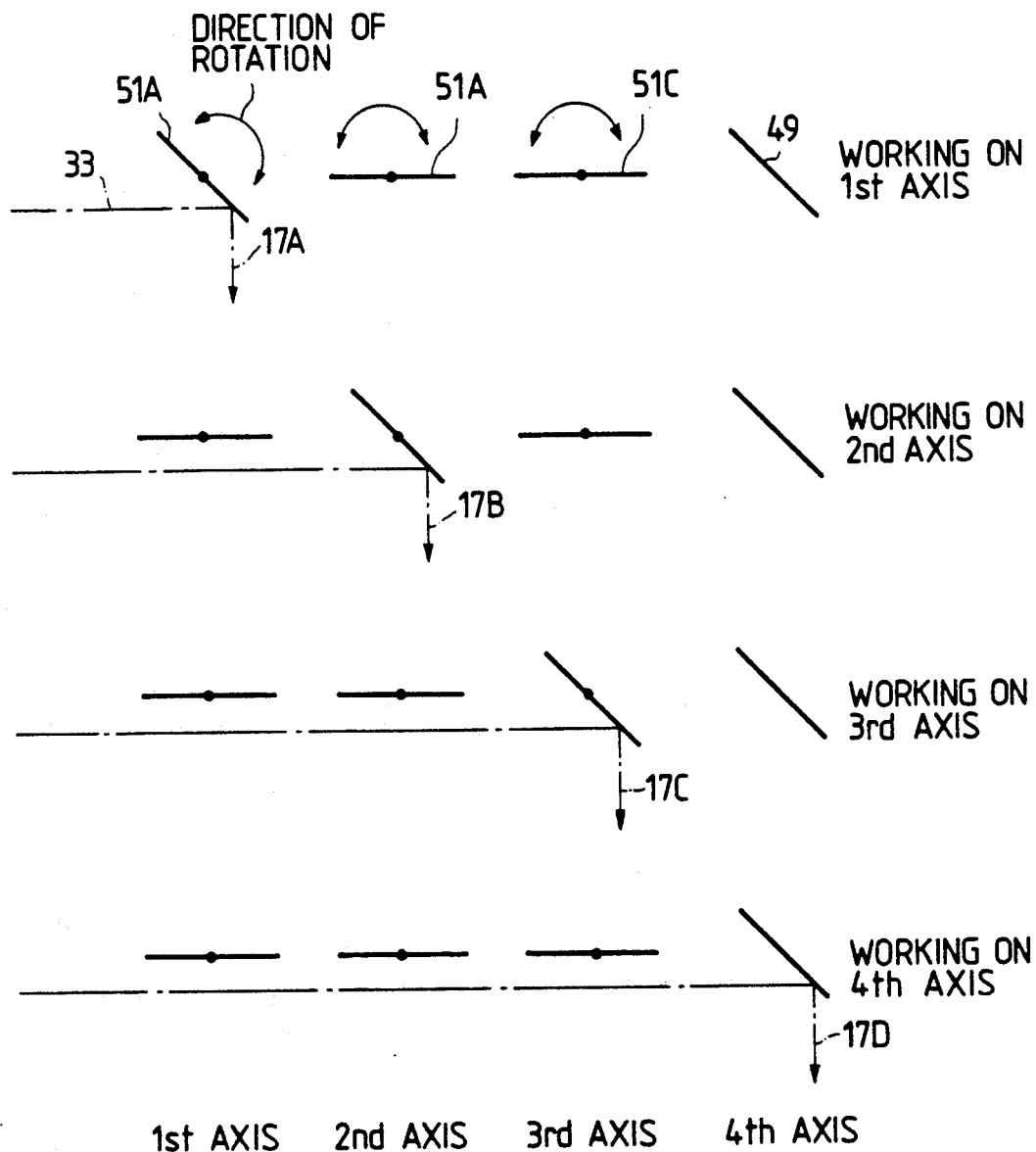
FIG. 15 is a schematic view showing the laser beam shifting in said second variation.

The reflecting members 52A-52C, being rotated by the pulse motors 51A-51C, can reflect or transmit the laser beam. Therefore, a hole can be formed on one of the boards 35A-35D by selecting a corresponding reflecting member and moving said member into the laser optical path. FIG. 15 schematically illustrates the mode of laser beam switching in this second variation.

Figures 16, 17:
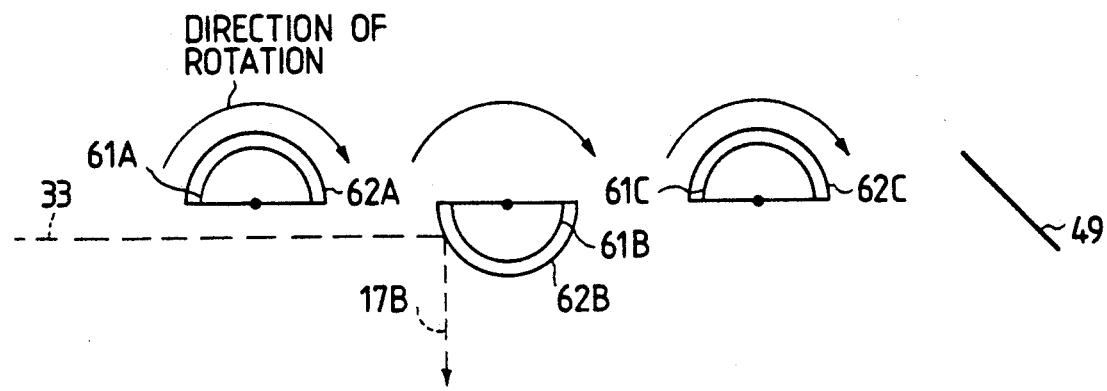
FIG. 16 is a view showing a third variation.
FIG. 17 is a table showing the comparison of the first embodiment, second variation and conventional working method.

A third variation shown in FIG. 16 is different, in the shape of the reflecting members, from the second variation. There are provided reflecting members 61A-61C with laser beam reflecting portions 62A-62C. The mode of function is the same as in the second variation.

FIG. 17 shows the comparison of hole formation in the foregoing embodiment, in the second variation and in the conventional method. The specimen employed was a two-sided glass-epoxy board, and a $CO_2$ laser was employed. The results are ranked by three grades as "○", "Δ" and "X" from good result, that is, the desired shape was evaluated by the absence of tapering, the damage was evaluated by the absence of resin erosion on the internal wall, and the hole diameter stability was evaluated by the extent of diameter fluctuation. The results indicate that the holes formed in the foregoing embodiment and in the second variation were improved in quality, in comparison with those formed in the conventional method.

The present invention is not limited by the foregoing embodiments and variations, but is naturally subject to modifications, for example, in the kind and number of motors, material of the boards, shape and structure of the reflecting members, shape of the reflecting portion on the reflecting member, rotating direction and sequence of rotation of the reflecting members, number of axes to which the laser beam is directed, presence or absence of fixed mirror etc.

As explained in the foregoing, the hole forming laser apparatus of the present invention is capable of hole formations by switching a laser beam to plural working optical axes. For this reason, it is not necessary to move the board after each hole formation, and it is rendered possible to work on plural boards by one positioning, so that the working efficiency can be improved.

Also, since splitting of a laser beam is not required, the intensity of the laser beam employed for hole formation is not lowered. It is, therefore, rendered possible to reduce the working time and to achieve satisfactory quality in hole formation.

Furthermore, the movement of the rotary reflecting mirror is conducted during a non-excited interval within a pulse of the laser beam. For this reason, the non-excited interval, which is required for achieving satisfactory hole formation, can be effectively utilized, and there is not required a separate time for mirror movement. In this manner the working efficiency can be further improved.

What is claimed is:

1. A laser working apparatus for working a plurality of articles with a laser, said apparatus comprising:

article support means for supporting the plurality of articles and moving the articles along predetermined coordinates to a work position where each article is to be worked;

laser oscillation means for providing an oscillated laser beam;

laser beam switching means for directing a laser beam to the plurality of articles on the article support means in succession, said laser beam switching means including laser direction changing means for changing a direction of the laser beam, and a drive controller for controlling the change in direction of the laser beam by said laser direction changing means such that the laser beam travels along a laser beam incidence axis to work the article;

oscillation control means for controlling the oscillation of the laser beam so the laser beam emitted from said laser oscillation means is pulsed;

sensing means for sensing incidence of the laser beam onto the laser beam incidence axis; and control means for controlling said article support means, said laser oscillation means, said laser beam switching means, and said oscillation control means on the basis of a signal from said sensing means, said control means controlling movement of the articles on said article support means to the work position where each article is to be worked, setting said laser beam switching means such that the laser beam from said laser oscillation means is directed to the work position where a first article on said article support means is to be worked, recognizing the incidence of the laser beam onto the laser beam incidence axis of the first article at the work position according to the signal from said sensing means to work the first article by the pulsed laser beam from said laser oscillation means, operating said laser beam switching means after the first article has been worked to set the laser beam switching means such that the laser beam from said laser oscillation means goes along the laser beam incidence axis of a second article, and recognizing incidence of the laser beam onto the laser beam incidence axis of the second article on the work position according to the signal from said sensing means to work the second article by the pulsed laser beam from said laser oscillation means.

2. An apparatus according to claim 1, wherein each article is a printed circuit board having a plurality of hole positions to be respectively worked to form a hole, and each printed circuit board is fixed on said article support means and worked by irradiating the laser beam onto the hole positions in succession.

3. An apparatus according to claim 2, wherein the first printed circuit board is irradiated with the laser beam by a predetermined energy at the first hole position, and the second printed circuit board is irradiated at the hole position, with the laser irradiation at the first hole position being controlled in consideration of the heat and discharged product caused by the laser beam.

* * * * *

UNITED STATES PATENT AND TRADEMARK OFFICE
CERTIFICATE OF CORRECTION

PATENT NO. : 5,302,798
DATED : April 12, 1994
INVENTOR(S) : Inagawa et al.

It is certified that error appears in the above-indentified patent and that said Letters Patent is hereby corrected as shown below: Title page, item:

[75]  INVENTORS:

"Hideo Inagawa" should read --Hideho Inagawa--.

COLUMN 1:

Line 59, "plural" should read --the--.
Line 60, "the" should read --plural--.

COLUMN 4:

Line 14, "pinted" should read --printed--.

Signed and Sealed this

Twenty-eight Day of March, 1995

Attest:

BRUCE LEHMAN

*Attesting Officer*     *Commissioner of Patents and Trademarks*